United States Patent
Sakamoto et al.

(10) Patent No.: US 6,893,965 B2
(45) Date of Patent: May 17, 2005

(54) METHOD OF PRODUCING SEMICONDUCTOR DEVICE

(75) Inventors: Yoshiaki Sakamoto, Kawasaki (JP); Kenji Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 49 days.

(21) Appl. No.: 10/292,436

(22) Filed: Nov. 13, 2002

(65) Prior Publication Data

US 2003/0113986 A1 Jun. 19, 2003

(30) Foreign Application Priority Data

Dec. 18, 2001 (JP) ........................................ 2001-384837

(51) Int. Cl.$^7$ .......................... H01L 21/20; C30B 25/02
(52) U.S. Cl. ...................................... 438/681; 117/104
(58) Field of Search .............................. 438/3, 57, 58, 438/680, 681, 785; 117/104

(56) References Cited

U.S. PATENT DOCUMENTS

| | | | | |
|---|---|---|---|---|
| 4,564,509 A | * | 1/1986 | Shealy et al. ............ | 423/210.5 |
| 5,104,425 A | * | 4/1992 | Rao et al. ...................... | 95/47 |
| 5,211,758 A | * | 5/1993 | Ota ............................. | 118/722 |
| 5,656,382 A | * | 8/1997 | Nashimoto ................... | 428/620 |
| 5,895,521 A | * | 4/1999 | Otsuka et al. ................ | 95/280 |
| 6,126,996 A | * | 10/2000 | Kirlin et al. ................. | 427/252 |
| 6,579,509 B1 | * | 6/2003 | Otsuka et al. ........... | 423/245.3 |
| 6,602,344 B2 | * | 8/2003 | Natori et al. ................. | 117/54 |
| 2003/0056726 A1 | * | 3/2003 | Holst et al. ................. | 118/715 |

FOREIGN PATENT DOCUMENTS

| | | |
|---|---|---|
| JP | 63-119521 | 5/1988 |
| JP | 2-47827 | 2/1990 |

* cited by examiner

Primary Examiner—Carl Whitehead, Jr.
Assistant Examiner—Jennifer M. Dolan
(74) Attorney, Agent, or Firm—Westerman, Hattori Daniels & Adrian, LLP (57) ABSTRACT

A method of producing a semiconductor device in which a film is formed on a substrate by a chemical vapor deposition (CVD) process, the method comprising purifying a source gas for a film to be formed by selectively removing at least one of components contained in the source gas, which does not pertain to reactions for the deposition of the film, based on the difference in molecular size between the component to be removed and other components.

15 Claims, 7 Drawing Sheets

SOURCE GAS ⇒

Fig.3B

PURGE GAS ⇒

METHOD OF PRODUCING SEMICONDUCTOR DEVICE

CROSS-REFERENCE TO RELATED APPLICATIONS

This application is based upon and claims priority of Japanese Patent Application No. 2001-384837, filed on Dec. 18, 2001, the contents thereof being incorporated herein by reference.

BACKGROUND OF THE INVENTION

1. Field of the Invention

The invention relates to a method of producing a semiconductor device and, particularly, to a method of producing a semiconductor device using a chemical vapor deposition process in which a mixed gas containing a reactive source gas, a non-reactive solvent gas, and the like, is fed.

2. Description of the Related Art

As one of semiconductor devices, a ferroelectric memory (also called ferroelectric RAM (FRAM)), which is a non-volatile memory utilizing a capacitor using a ferroelectric film, is known. Such an FRAM is used as a memory in an IC card, or an alternative to a general purpose memory such as a DRAM or flash memory. In an FRAM, PZT ($PbZr_xTi_{1-x}O_3$) or the like is used as a material for the ferroelectric film, and a lower electrode and an upper electrode are formed with the ferroelectric film therebetween.

The formation of a ferroelectric film for an FRAM is performed using a sputtering or sol-gel process. On the other hand, it is considered that a metal organic chemical vapor deposition (MOCVD) process, which is superior in the density and the step coverage of the deposited ferroelectric film, is promising for a purpose of obtaining a memory having an increased degree of integration. For example, when a PZT film is formed by an MOCVD process, it is known that, particularly, a lower electrode, on which the PZT film is to be deposited, is most appropriately an $IrO_2/Ir$ film, in that the lower electrode must have adhesion to the surface of a substrate in order to make a capacitor structure comprising a PZT film on an insulating film on the surface of a silicon substrate having a transistor fabricated therein, and diffusion of lead (Pb) and hydrogen to the lower electrode at an elevated temperature during the film formation must be prevented (Saito et al., Shin-Gaku Giho, pp31–35, March, 2000).

Figure 1:
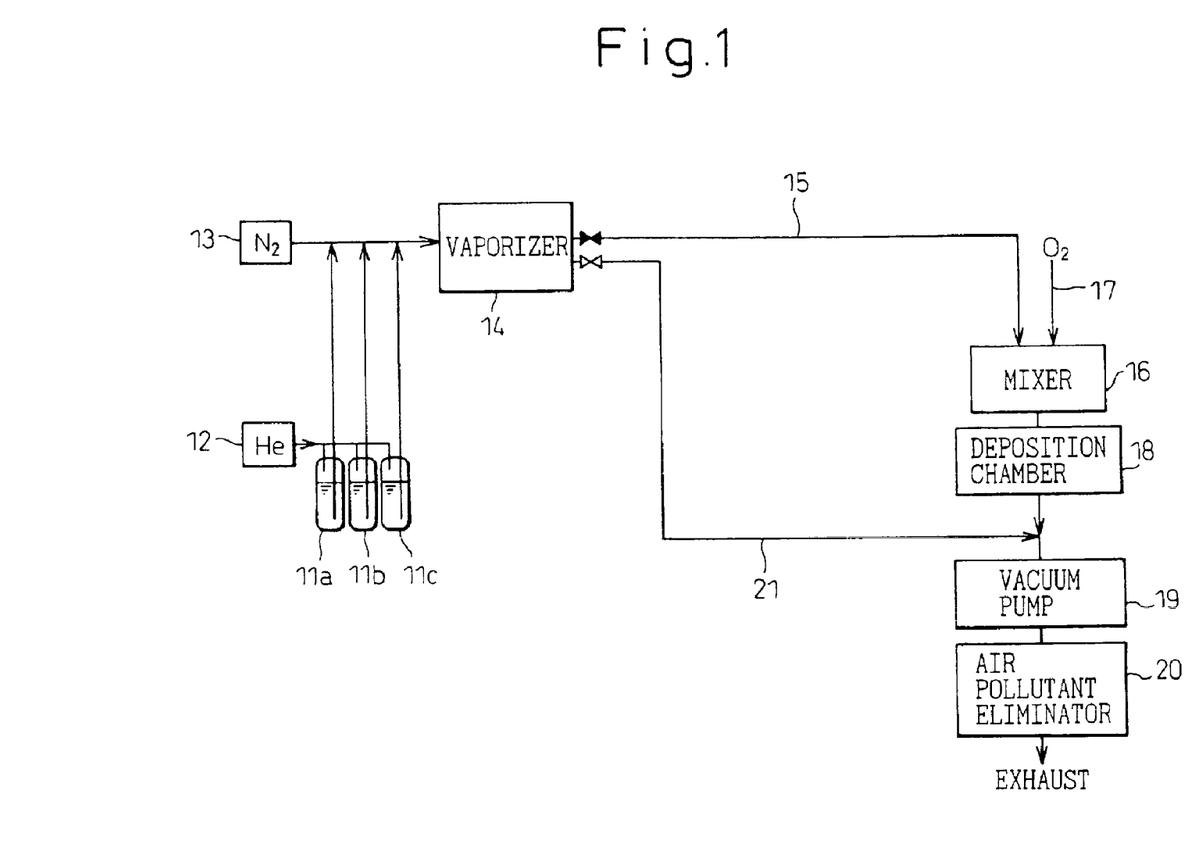
FIG. 1 is an illustration of a prior method of producing a semiconductor device, in which a ferroelectric film is formed by an MOCVD process.

By way of example, the formation of a PZT film according to a prior MOCVD process using a flash vaporization is described by referring to FIG. 1. To feed, as source gases, metal elements (in this case, lead (Pb), zirconium (Zr), and Titanium (Ti)) needed to the film formation in the state of organometallic molecules, organic solvent solutions of organic metal materials for the respective metal elements are delivered from raw material containers 11a, 11b, 11c containing the respective solutions by introducing into the containers a pressure delivering gas, such as helium, from a pressure delivering gas tank 12, and are combined with a carrier gas, such as nitrogen gas, from a carrier gas tank 13 for the vaporization of the raw materials, to be introduced in a vaporizer 14 and to be vaporized. A mixed source gas comprising the vaporized organic metals and organic solvent is introduced to a mixer 16 through a line 15, where the mixed source gas is mixed with oxygen gas from a line 17 to be fed to a chamber 18 for the film formation. A heated substrate (not shown) is positioned in the chamber 18, where the organometallic molecules are decomposed at an elevated temperature and are reacted with oxygen to deposit a desired PZT film on the substrate. An exhaust gas comprising reaction by-product gases and non-reacted source gases is discharged from the chamber 18 by a vacuum pump 19, and is vented to atmosphere through an air pollutant eliminator 20. A line 21 from the vaporizer 14 to the vacuum pump 19 is used to allow the source gases to bypass the chamber 18 and to be vented through the air pollutant eliminator 20, during the non-formation of film.

In general, organometallic materials are supplied in the form of liquids having the organic metals dissolved in organic solvents, as described above, and the liquid material is vaporized to form a source gas and to be fed to a chamber for the film formation. The organic solvent is also vaporized and fed to the chamber together with the organic metals. As the organic solvent, an solvent allowing the concentration of the organic metal material in the liquid to be high, i.e., having a good solubility of the organic metal material, is used to efficiently supply the organic metal. For this reason, tetrahydrofuran (THF, $(CH_2)_4O$), butyl acetate ($CH_3COOC_4H_9$) or the like are, in general, selected as the organic solvents.

Figure 2A:
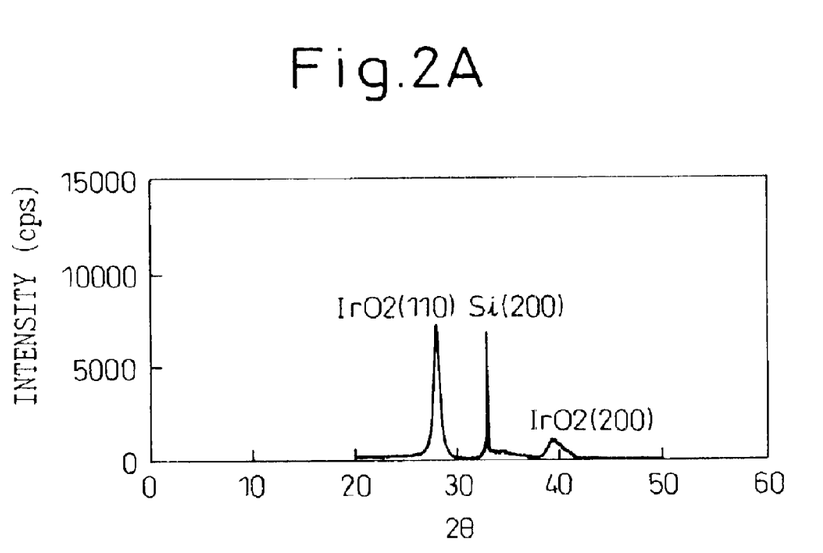
FIGS. 2A and 2B are X-ray diffraction patterns of an $IrO_2$ film before and after the feeding of the butyl acetate of an organic solvent, respectively.
Figure 2B:
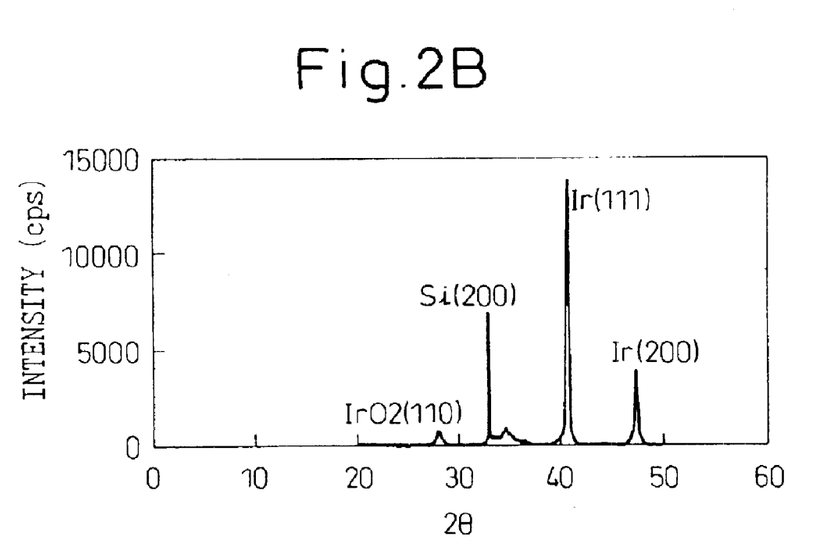

As set out above, an $IrO_2/Ir$ film (which is made by forming an Ir film on a substrate and oxidizing the upper portion thereof) is provided on the surface of a substrate on which a film of a ferroelectric, such as PZT, is to be deposited. Various organic solvents, such as those used for dissolving an organic metal material for the deposition of a ferroelectric film, has a reducing power, and during the formation of PZT film on an $Ir_2O$ film, organic solvent molecules in a source gas fed onto a substrate act as a reducing agent for the $IrO_2$ film on the substratre. By way of example, the change of orientation of crystal of an $IrO_2$ film before and after feeding butyl acetate onto a substrate provided with the film, which was evaluated by X-ray diffraction (XRD), is shown in FIGS. 2A and 2B. The orientation peak of $IrO_2$ (110) found before the feeding of butyl acetate (FIG. 2A) almost disappears after the feeding thereof, as seen in FIG. 2B, and it can be seen, in FIG. 2B, that the peak of Ir(111) is noticeable. This indicates that oxygen was expelled from the $IrO_2$ film to leave an Ir film. The disappearance of the $IrO_2$ film means that a barrier effect of the $IrO_2$ film on the diffusion of lead and hydrogen during the deposition of a PZT film is lost, ultimately resulting in the cause of degradation of fatigue characteristics of the PZT film (stability of the amount Qsw of the switching charge after repeated polarization inversions).

SUMMARY OF THE INVENTION

The invention aims to solve the above problems to thereby provide a method which enables production of a semiconductor device, such as an FRAM, using a film of ferroelectric, such as PZT, having stable fatigue characteristics.

In the invention, to obtain a ferroelecric film having stable fatigue characteristics, there is provided a purification process in which organic solvent molecules having reducing properties in a source gas are removed at the stage prior to the feeding to a chamber for film formation, so that the molecules do not reduce an $IrO_2$ film which functions as a barrier to diffusion of lead and hydrogen during the formation of the film.

Thus, the method of producing a semiconductor device of the invention is a method in which a film is formed on a substrate by a chemical vapor deposition (CVD) process, the method comprising purifying a source gas for a film to be formed by selectively removing at least one of components contained in the source gas, which does not pertain to reactions for the deposition of the film, based on the difference in molecular size between the component to be removed and other components.

BRIEF DESCRIPTION OF THE DRAWINGS

The above and other objects and advantages of the invention will be well understood and appreciated by a person with ordinary skill in the art, from consideration of the following detailed description made by referring to the attached drawings, wherein.

DETAILED DESCRIPTION OF THE INVENTION

Methods of producing a semiconductor device include those comprising a step of depositing a film, such as a film of PZT ferroelectric, on a substrate. Although a PZT film can be formed by a sputtering or sol-gel process, it can be said that a favorable method for making memories having an increased degree of integration is a metal organic chemical vapor deposition (MOCVD) process which is useful for the miniaturization of the memories. In the MOCVD process, organic metal materials dissolved in an organic solvent are vaporized together with the solvent and are delivered to a deposition chamber, where deposition reactions take place. The solvent gas fed to the deposition chamber commonly does not pertain to the deposition reactions and, for the deposition of a PZT film, it is a component having an unfavorable effect of reducing an $IrO_2$ film which is useful for the prevention of diffusion of lead and hydrogen to a lower electrode. According to the invention, a ferroelectric film can be deposited in the absence of such a component which is unfavorable in the deposition step.

In chemical vapor deposition processes employed for the manufacture of semiconductor devices, various source gases are used. Hereinafter, an MOCVD process using organic metal materials for the deposition of a film of a ferroelectric, such as PZT, is mainly described. However, the invention is also applicable to methods of producing semiconductor devices using other CVD processes.

In the invention, a component, such as an organic solvent, contained in the source gas, which does not pertain to reactions for the deposition of a film, is separate and removed, based on the difference in molecular size between the component to be removed and other components. As a specific removing method, separation by adsorption or separation by a permeable film, which uses the difference in molecular size between the molecule of the component to be removed and the molecules of other components in a source gas, is used. Molecular sizes of organic metals for the deposition of a film of a ferroelectric, such as PZT, are, in general, three to five times the molecular size of an organic solvent for the dissolution thereof, and the solvent molecule in a vapor phase can be easily separated and removed from the organic metal molecules by such a removing method. In Table 1, typical examples of organic metal materials and organic solvents used for the formation of a ferroelectric film by an MOCVD process, and the effective diameters of molecules of thereof are summarized.

TABLE 1

| Components | Chemical formulae or Name of compounds | | Effective diameters of molecule |
|---|---|---|---|
| Organic solvents | $(CH_2)_4O$ $CH_3COOC_4H_9$ | | about 0.6 nm |
| Organic metals | $Pb(dpm)_2$ | $Ba(dpm)_2$ | about 2–3 nm |
| | $Zr(dmhd)_4$ | $Ir(dpm)_3$ | |
| | $Zr(dpm)_4$ | $Ir(EtCp)_2$ | |
| | $Ti(OiPr)_2(dmhd)_2$ | $Ir(EtCp)(cod)$ | |
| | $Ti(OiPr)_2(dpm)_2$ | $Ru(dpm)_3$ | |
| | $La(dpm)_3$ | $Ru(EtCp)_2$ | |
| | $Ca(dpm)_2$ | $Ru(MeCp)_2$ | |
| | $Sr(dpm)_2$ | $Pt(AcAc)_2$ | |
| | $Sr[Ta(OEt)_6]_2$ | $Pt(HFA)_2$ | |
| | $Bi(OtAm)_3$ | | |

Figure 3A:
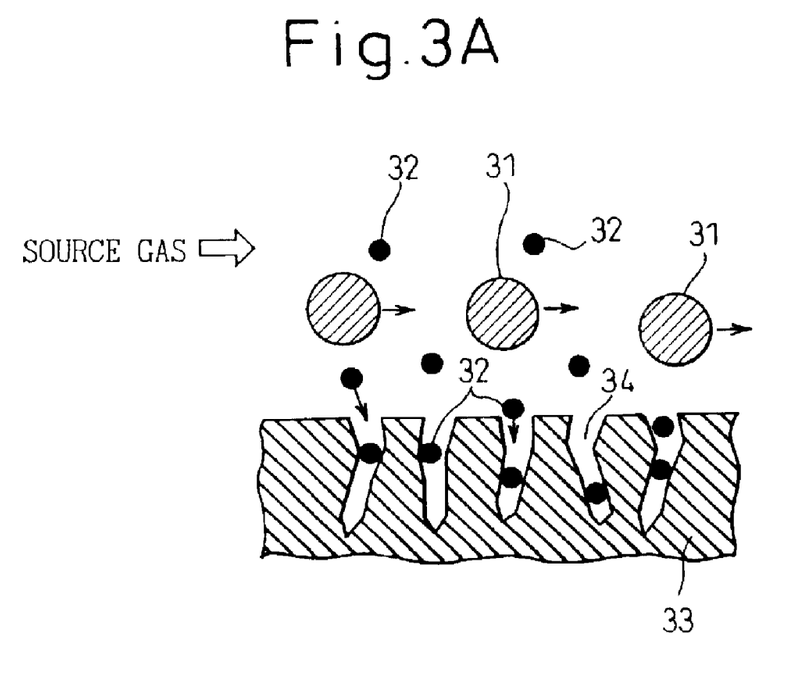
FIGS. 3A and 3B are illustrations of an adsorption process and a regeneration process, respectively, in the adsorption and separation treatment used in the invention.
Figure 3B:
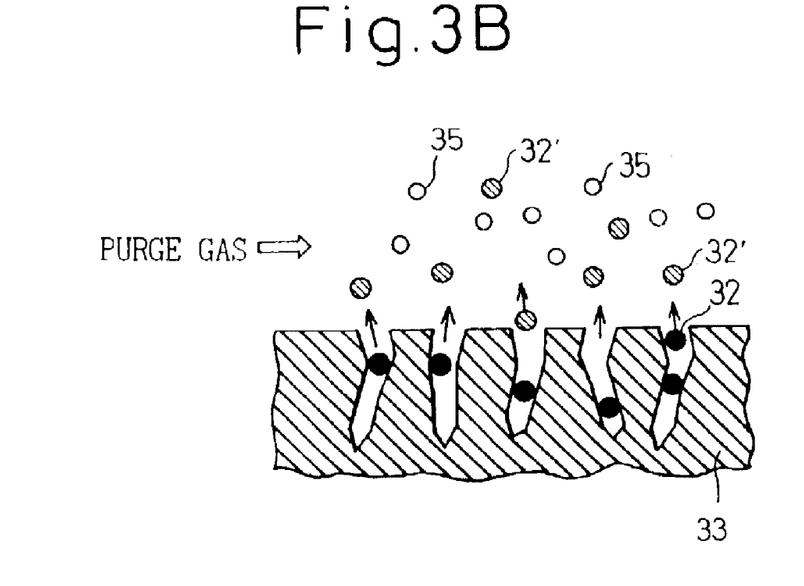

In the table, the following abbreviations are used for the ligands in the organic metals.
dpm: dipivaloylmethanato
dmhd: dimethylheptanedionato
OiPr: isopropoxido
Oet: ethoxido
OtAm: tert-amyl oxido
EtCp: ethylcyclopentadienyl
cod: cyclooctadien
MeCp: methylcyclopentadienyl
AcAc: aetylacetonato
HFA: hexafluoroacetylacetonato In the separation by adsorption, during the passage of a source gas containing organometallic molecules 31 and organic solvent molecules 32 over an adsorbing body 33, the solvent molecules 32 having a smaller molecular size are preferentially captured into pores 34 of the adsorbing body 33, to thereby provide a purified source gas comprising only the organometallic molecules 31, as shown in FIG. 3A. The solvent molecules 32 adsorbed by the adsorbing body 33 can be decomposed and desorbed from the pores 34 of the adsorbing body 33 by being heated while allowing a purge gas to flow in a subsequent step of regenerating the adsorbing body, and the desorbed molecules 32' can be exhausted together with the purge gas molecules 35, as shown in FIG. 3B. The adsorbing body 33 regenerated in the regeneration step can be used for the purification of the source gas by the adsorption separation again.

As the adsorbing body, an adsorbent contained in an adsorber (adsorbing vessel) can be used. Examples of the adsorbent useful for the selective removal of organic solvent molecules from organometallic molecules are those known as molecular sieves. For example, molecular sieve carbon (Kuraray Co.), which is one of activated carbons, can be used.

Since the step of regenerating an adsorbing body is necessary in the adsorption separation using an adsorbing body, as described above, it is preferred that a plurality of adsorbing systems comprising an adsorber are provided, so as to allow the source gas purification step to be effected in one system while regenerating another system.

Figure 4:
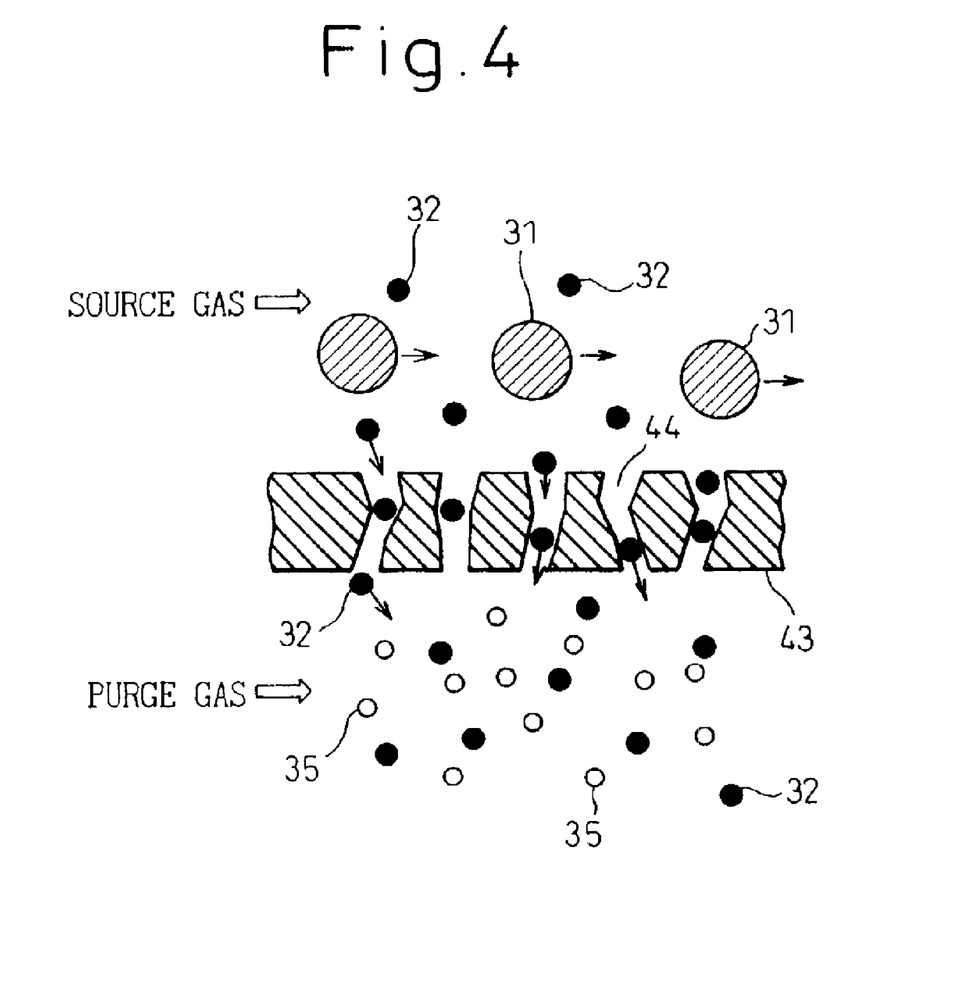
FIG. 4 illustrates a separation by a permeable film used in the invention.

In the separation by a permeable membrane, a purified source gas containing only organometallic molecules 31 is obtained by passing a source gas containing organometallic molecules 31 and organic solvent molecules 32 at one side of a permeable separating membrane 43, during which solvent molecules 32 having a smaller molecular size are preferentially passed through pores 44 of the separating membrane 43 to be moved to the other side of the separating membrane 43, as shown in FIG. 4. The solvent molecules 32 having passed through the separating membrane 43 are exhausted along with purge gas molecules 35 flowing at the other side.

The separating membrane is, in general, contained in a separator, and isolates the side of source gas and the side of permeated gas (purge gas) from each other. As the separating membrane, one of various permeable membranes useful for the separation of molecules can be used. For example, various membranes in the form of sheet or hollow fiber, such as zeolite membranes (Mitsui & Co.), hollow fiber membranes (Osaka Sanso Kogyo and Nagayanagi Sangyo), can be used

EXAMPLES

The invention will now be further described referring to the following examples, although the invention is not limited to these examples.

Figure 5:
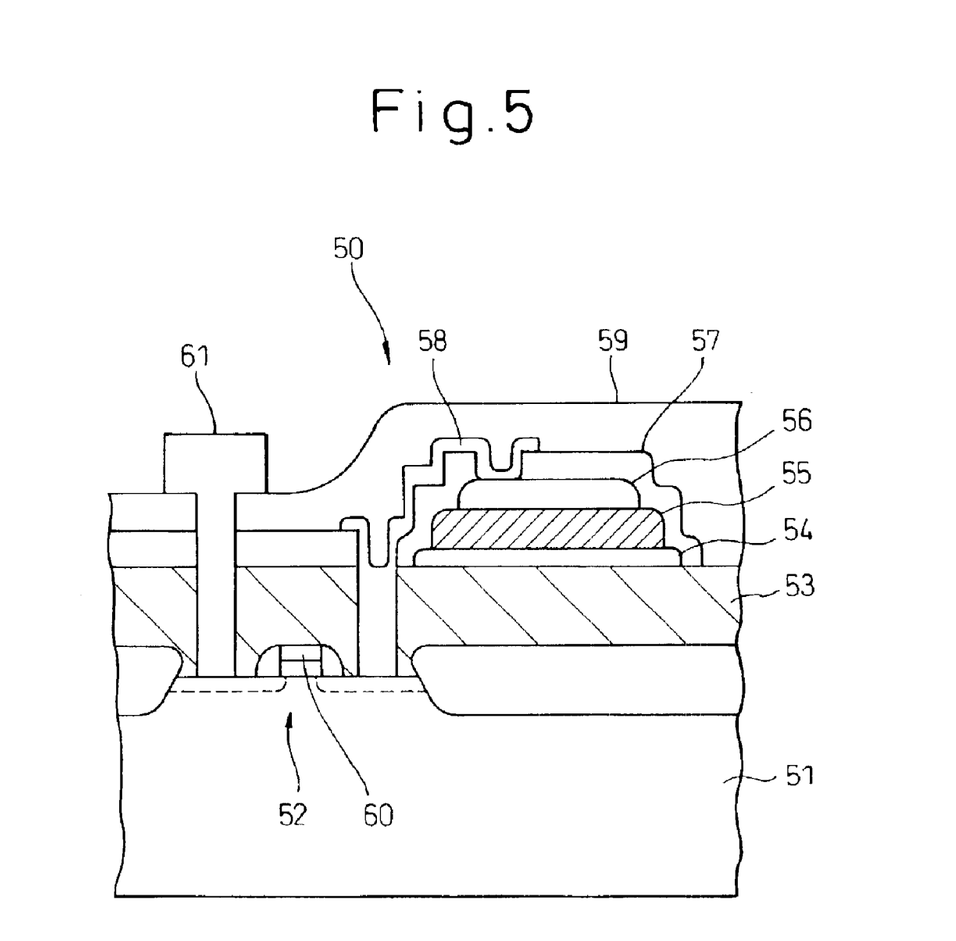
FIG. 5 illustrates a semiconductor device produced in the Examples.

In the examples, the manufacture of an FRAM by forming a capacitor comprising a film of PZT ferroelectric on a silicon substrate having a transistor fabricated therein, is described. As shown in FIG. 5, an insulating film 53 is formed by depositing $SiO_2$ on the surface of a silicon substrate in which a transistor 52 is fabricated by a common CMOS process, after which an Ir film is deposited, and the surface thereof is then oxidized to thereby form an lower electrode 54 of $IrO_2$/Ir. Subsequently, a ferroelectric PZT film 55 is formed on the lower electrode 54 by an MOCVD process using a flash vaporization, as in the prior example earlier described. A film of Pt is then deposited on the film 55 to thereby form an upper electrode 56. Thereafter, an FRAM 50 comprising a word line 60 and a bit line 61 is manufactured through the steps of forming an insulating film 57 covering a capacitor structure made up of the lower electrode 54, the ferroelectric PZT film 55 and the upper electrode 56, forming wiring layer 58 for the connection of the upper electrode 56 with the transistor 52, forming a covering film 59, and the like. Such a structure of FRAM as a semiconductor device as well as a method for the manufacture thereof are well known, and do not need to be described herein in detail.

Example 1

Figure 6:
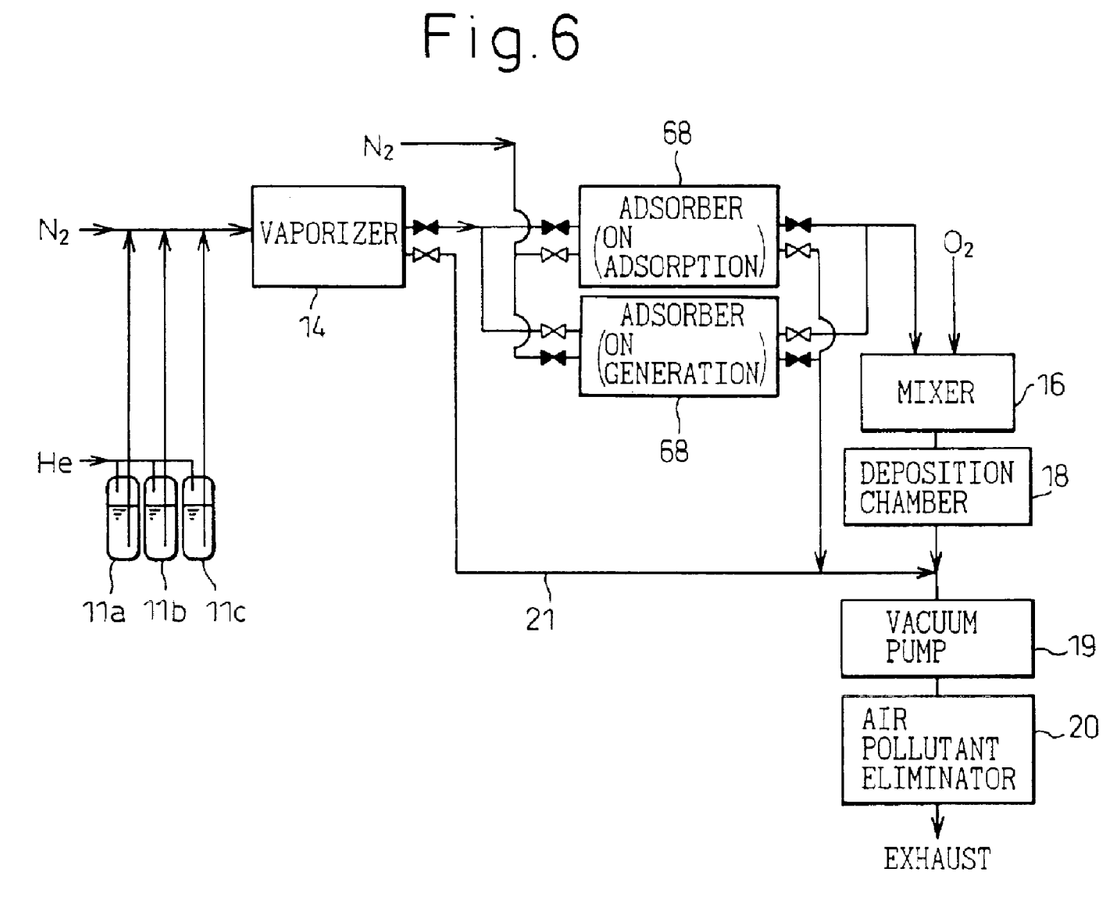
FIG. 6 is a block flow diagram of the method used in Example 1.

In this example, a ferroelectric PZT film was formed by an MOCVD process using flash evaporation, according to the block flow diagram shown in FIG. 6. The process shown in FIG. 6 involves, in principle, a source gas feeding system, a deposition chamber, and a gas exhausting system, as those used for the formation of a ferroelectric PZT film by a common MOCVD process earlier described making reference to FIG. 1.

The source gas feeding system delivers, to a vaporizer 14, organic metal materials (liquids) transferred from raw material containers 11a, 11b, 11c respectively containing solutions of organometallic materials of $Pb(dpm)_2$, $Zr(dpm)_4$ and $Ti(OiPr)(dpm)_2$ dissolved in tetrahydrofuran of organic solvent, by pressure of helium gas, and combines them with a carrier gas of nitrogen, and vaporizes them by heating under vacuum to form a source gas (flash vaporizing method). The source gas feeding system in this example further includes absorbers 68, in which molecular sieve carbon (Kuraray Co.), which is one of molecular sieves, having many pores of a diameter of 1 nanometer or smaller, so as to be useful for the adsorption of the molecules of the organic solvent, is contained. In the course of the source gas from the vaporizer 14 being passed through the adsorber 68, the molecules of the organic solvent are removed by adsorption, and a purified source gas leaves the adsorber 68. The purified source gas is then delivered to a mixer 16, and is uniformly mixed with oxygen gas, to thereby be fed, as a reaction gas, to a deposition chamber 18.

In the deposition chamber 18, a substrate (which has already undergone treatment from the fabrication of the transistors 52 (FIG. 5) to the formation of the lower electrode 54 (FIG. 5)) is positioned on a stage, and is kept at an elevated temperature by a heater with which the stage is provided. The reaction gas is fed onto the surface of the substrate, is thermally decomposed, and is reacted on the substrate to form a PZT film.

The gas exhausting system includes a vacuum pump 19 for evacuating the deposition chamber 18 and holding it at a certain vacuum reaction pressure, and an air pollutant eliminator 20 for rendering exhaust gas from the vacuum pump harmless prior to the discharge of the exhaust gas to the atmosphere.

In this example, unlike the conventional method shown in FIG. 1, the adsorbers 68 for adsorbing an organic solvent are added in the route from the vaporizer 14 to the mixer 16 in the common gas feeding system of an MOCVD process, as seen in FIG. 6. Two adsorbers 68 are alternately in service in this example. The purification of the source gas by the adsorbent (the molecular sieve carbon (Kuraray Co.) herein) in the vaporizer 68 which is in service, is as set out above. At the stage of the adsorbent having being saturated with the adsorbed organic solvent molecules, the adsorver undergoes a regeneration process, and the purification of the source gas is taken over by another adsorber 68. The regeneration of the adsorber 68 having terminated the adsorbing process is carried out by heating it to, for example, 80° C. or above while running a purge gas, such as nitrogen, into the adsorber. Exhaust gas from the adsorber on regeneration is sent to the vacuum pump 19 through a line 21 connecting the vaporizer 14 to the vacuum pump 19, and is released to the atmosphere through the air pollutant eliminator 20. The adsorbing process and the regeneration process may be carried out by switching valves at the inlets and outlets of the respective adsorbers. In FIG. 6, the blackened valves are open, and the non-blackened valves are closed. At the conditions shown in the drawing, the upper adsorber is assigned to the adsorbing process, and the lower adsorber is subjected to the regenaration process. In this way, by the use of two or more adsorbers in parallel, the adsorbing process of a source gas and the regeneration process of adsorber can be carried out in parallel.

Example 2

Figure 7:
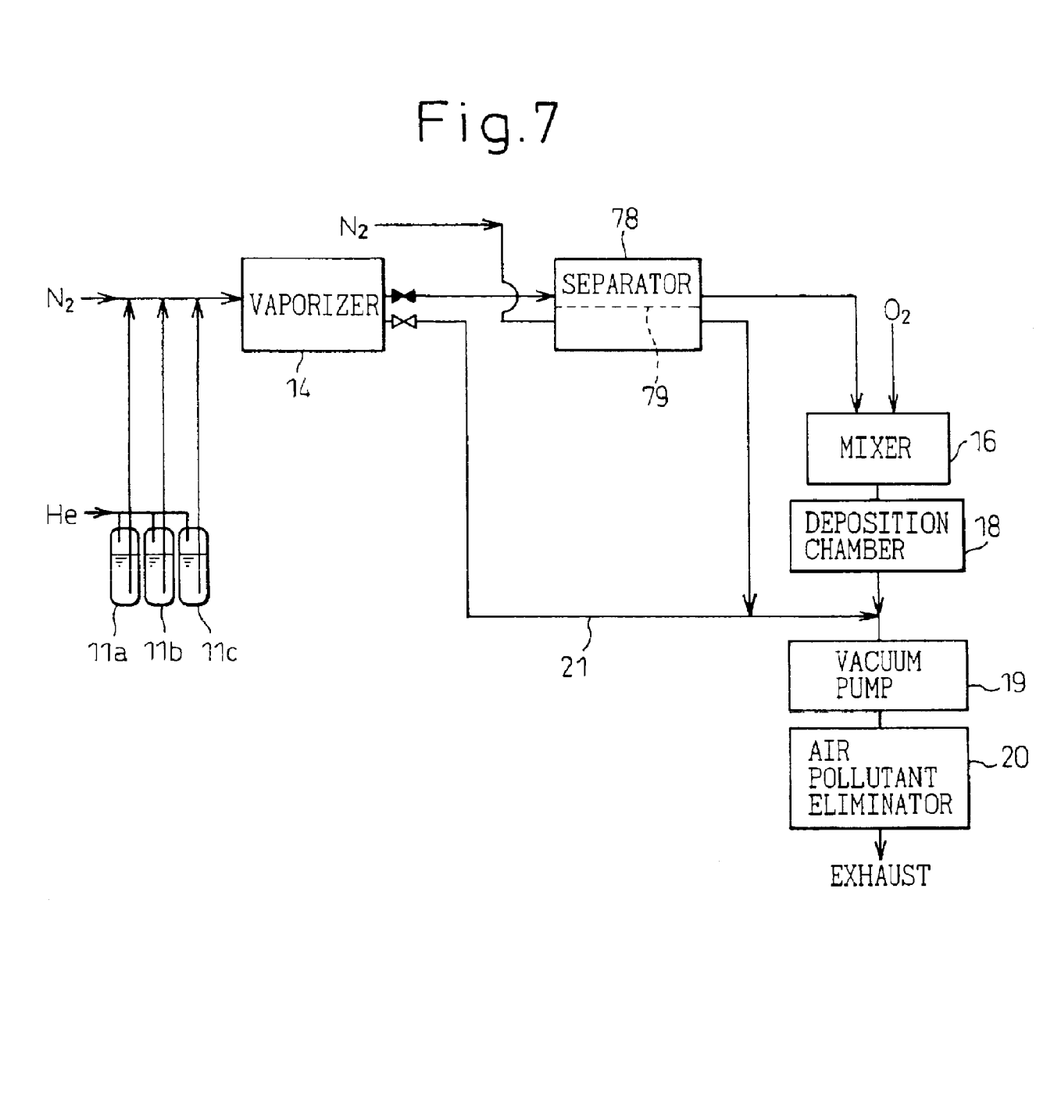
FIG. 7 is a block flow diagram of the method used in Example 2.

In this example, a ferroelectric PZT film was formed also by an MOCVD process using flash evaporation, according to the block flow diagram shown in FIG. 7. The process shown in FIG. 7 is similar to that shown in FIG. 6, except that the adsorbers 68 shown in FIG. 6 are replaced by a separator 78.

The separator 78 used in this example contains a zeolite membrane (Mitsui & Co.) as a separating membrane 79 having many pores of a diameter of 10 nanometers or less so as to be effective for the adsorption of organic solvent molecules. The source gas from the vaporizer 14 passes through the source gas side of the separator 78, in the course of which the organic solvent molecules are removed from the source gas by permeating through the pores of the separating membrane 79 and moving to the permeated gas side of the membrane 79, whereby the source gas is purified. The organic solvent molecules moved to the permeated gas side are exhausted from the separator 78 along with a purge gas, such as nitrogen, supplied thereto, and are sent to the vacuum pump 19 through a line 21 connecting the vaporizer 14 to the vacuum pump 19, before being released to the atmosphere through the air pollutant eliminator 20.

In both Examples 1 and 2, by the MOCVD process using $Pb(dpm)_2$, $Zr(dpm)_4$ and $Ti(OiPr)(dpm)_2$ as organometallic materials, a PZT film can be formed without reducing the $IrO_2$ of the $IrO_2$/Ir lower electrode.

According to the invention, it is also possible to form a ferroelectric film using an organometallic materials other than these materials. By way of example, one or more of materials for La, Ca and Sr ($La(dpm)_3$, $Ca(dpm)_2$, $Sr(dpm)_2$, etc.) shown in Table 1 can be added to the materials for the film formation during the PZT film formation in Examples 1 and 2, whereby degradation of electrical properties of the PZT film over time can be suppressed.

Also, by applying an MOCVD process using at least one of the materials for Ir, Ru and Pt shown in Table 1 to the formation the upper electrode layer after the formation of a PZT film, an oxide electrode can be formed without reducing the PZT film at the surface of the substrate.

Further, a ferroelectric SBT ($SrBi_2Ta_2O_9$) film can be formed using, as organometallic materials, materials for Sr, Bi and Ta as shown in Table 1, a ferroelectric BST ($Ba_xSr_{1-x}TiO_3$) film can be formed using materials for Ba, Sr and Ti as shown in Table 1, and a ferroelectric BLT ($Bi_{4-x}La_xTi_3O_{12}$) film using materials for Bi, La and Ti as shown in Table 1, without reducing an oxide lower electrode at the surface of a substrate in each case.

As described, the invention provides an MOCVD process which does not supply organic solvent molecules having reducing properties onto a substrate having an oxide film formed thereon, to thereby make it possible to form a ferroelectric film without affecting the oxide film structure on a substrate. Particularly with the formation of a PZT film using an $IrO_2$/Ir film for an electrode layer on a substrate, the reduction of $IrO_2$ can be prevented, so that both the adhesion of the film to the substrate and the function of a barrier to diffusion of lead and hydrogen can be secured, and fatigue characteristics of a non-volatile memory, which is important for electric properties thereof, can be stabilized. Also, during the formation of an electrode film on a PZT film on a substrate, the PZT film is similarly not reduced, so that electric properties of a product non-volatile memory are not damaged.

Consequently, according to the invention, it becomes possible to form a film of a ferroelectric, such as PZT, by an MOCVD process which is superior in density and step coverage of the formed film, without damaging the properties of a semiconductor device to be produced. Thus, the invention greatly contributes to increasing the degree of integration of a semiconductor device such as a memory.

What is claimed is:

1. A method of producing a semiconductor device in which a film is formed on a substrate by an organic metal chemical vapor deposition (MOCVD) process using an organic metal or metals as a material or materials for the film formation, the method comprising purifying a source gas for a film to be formed by separating and removing an organic solvent in which the organic metal or metals contained in the source gas are dissolved based on the difference in molecular size between the organic solvent and other components.

2. The method of claim 1, wherein the selective removal is carried out by an adsorbing process using an adsorbent.

3. The method of claim 2, wherein a molecular sieve is used as the adsorbent.

4. The method of claim 2, wherein the adsorbent preferentially adsorbs the component to be removed.

5. The method of claim 2, wherein two or more adsorbers, which contain the adsorbent, are used in parallel.

6. The method of claim 1, wherein the selective removal is carried out by a process using a separating membrane.

7. The method of claim 6, wherein a membrane or membranes in the form of sheet or hollow fiber are used as the separating membrane.

8. The method of claim 6, wherein the membrane allows the component to be removed to preferentially permeate therethrough.

9. The method of claim 8, wherein the film to be form is a film of an oxide comprising the metal elements Pb, Zr and Ti.

10. The method of claim 9, wherein the film of the oxide further comprises at least one of the metal elements La, Ca and Sr.

11. The method of claim 1, wherein the film to be formed is a film of an oxide comprising metal elements of Ba, Sr and Ti.

12. The method of claim 1, which is used for the production of a ferroelectric memory.

13. A method of producing a semiconductor device in which a film is formed on a substrate by a chemical vapor deposition (CVD) process, the method comprising purifying a source gas for a film to be formed by selectively removing a least one of components, contained in the source gas, which does not pertain to reactions for the deposition of the film, based on the difference in molecular size between the component to be removed and other components; and after the formation of the oxide film, forming an oxide or metalic film comprising one metal element Ir, Ru and Pt by the use of an MOCVD process which uses an organometallic material or materials for the formation of the film dissolved in an organic solvent, and feeding a source gas which is purified by selectively removing the organic solvent from a gas comprising the organometallic material or materials and the organic solvent having been vaporized;

wherein the selective removal is carried out by a process using a separating membrane;

wherein the membrane allows the component to be removed to preferentially permeate therethrough; and wherein the film to be formed is a film of an oxide comprising be metal elements Pb, Zr and Ti.

14. method of producing a semiconductor device in which a film is formed on a substrate by a chemical vapor deposition (CVD) process, the method comprising purifying a source gas for a film to be formed by selectively removing at least one of components, contained in the source gas, which does not pertain to reactions for the deposition of the film, based on the difference in molecular size between the component to be removed and other components;

wherein the film to be formed is a film of an oxide comprising metal elements of Sr, Bi and Ta.

15. A method of producing a semiconductor device in which a film is formed on a substrate by a chemical vapor deposition (CVD) process, the method comprising purifying a source gas for a film to be formed by selectively removing at least one of components, contained in the source gas, which does not pertain to reactions for the deposition of the film, based on the difference in molecular size between the component to be removed and other components;

wherein the film to be formed is a film of an oxide comprising metal elements of Bi, La and Ti.

* * * * *